(12) United States Patent
Gan et al.

(10) Patent No.: US 11,011,456 B2
(45) Date of Patent: May 18, 2021

(54) LEAD FRAMES INCLUDING LEAD POSTS IN DIFFERENT PLANES

(71) Applicant: Infineon Technologies AG, Neubiberg (DE)

(72) Inventors: Thai Kee Gan, Melaka (MY); Lee Shuang Wang, Melaka (MY); Jo Ean Joanna Chye, Penang (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/460,408

(22) Filed: Jul. 2, 2019

(65) Prior Publication Data
US 2021/0005541 A1  Jan. 7, 2021

(51) Int. Cl.
*H01L 23/495* (2006.01)
*H01L 21/56* (2006.01)
*H01L 21/48* (2006.01)
*H01L 23/00* (2006.01)
*H01L 23/31* (2006.01)

(52) U.S. Cl.
CPC .... *H01L 23/49575* (2013.01); *H01L 21/4825* (2013.01); *H01L 21/56* (2013.01); *H01L 23/3121* (2013.01); *H01L 23/49503* (2013.01); *H01L 23/49517* (2013.01); *H01L 23/49541* (2013.01); *H01L 23/49548* (2013.01); *H01L 23/49551* (2013.01); *H01L 24/85* (2013.01); *H01L 24/48* (2013.01); *H01L 2224/48177* (2013.01)

(58) Field of Classification Search
CPC ......... H01L 23/49555; H01L 23/49551; H01L 23/49571; H01L 23/49503; H01L 23/4951; H01L 23/49541; H01L 23/49544; H01L 23/49548–49555; H01L 23/49575
See application file for complete search history.

(56) References Cited

U.S. PATENT DOCUMENTS

| | | | |
|---|---|---|---|
| 8,581,376 B2 * | 11/2013 | Yilmaz | H01L 23/49562 257/676 |
| 2008/0029860 A1 | 2/2008 | Gao | |
| 2008/0191325 A1 | 8/2008 | Shirasaka | |
| 2012/0061813 A1 | 3/2012 | Ho et al. | |
| 2013/0043574 A1 | 2/2013 | Williams et al. | |
| 2017/0077069 A1 | 3/2017 | Danno et al. | |
| 2018/0040540 A1 | 2/2018 | Webster | |

* cited by examiner

*Primary Examiner* — Jose R Diaz
(74) *Attorney, Agent, or Firm* — Dicke, Billig & Czaja, PLLC (57) ABSTRACT

A lead frame includes a die pad having a surface, a first lead post, a first lead, a second lead post, and a second lead. The first lead post has a surface coplanar with the surface of the die pad and is in a first plane. The first lead is coupled to the first lead post. The second lead post is in a second plane different from the first plane. The second lead is coupled to the second lead post.

20 Claims, 13 Drawing Sheets

LEAD FRAMES INCLUDING LEAD POSTS IN DIFFERENT PLANES

BACKGROUND

In semiconductor packages, heat may be generated by the semiconductor die. For high power semiconductor packages, the heat generated by the semiconductor die may be very high, thus requiring the heat be transferred out of the semiconductor package into the environment through a heat sink. Typical semiconductor packages include one die pad (e.g., heatsink) for heat dissipation. Therefore, the semiconductor package may accommodate just one semiconductor die. By accommodating just one semiconductor die, the semiconductor package design and/or electrical configuration may be limited.

For these and other reasons, a need exists for the present disclosure.

SUMMARY

One example of a lead frame includes a die pad having a surface, a first lead post, a first lead, a second lead post, and a second lead. The first lead post has a surface coplanar with the surface of the die pad and is in a first plane. The first lead is coupled to the first lead post. The second lead post is in a second plane different from the first plane. The second lead is coupled to the second lead post.

One example of a semiconductor package includes a die pad, a first lead post, a first lead, a second lead post, a second lead, a first die, a second die, and a mold material. The die pad has a first surface and a second surface opposite to the first surface of the die pad. The first lead post has a first surface and a second surface opposite to the first surface of the first lead post. The first lead is coupled to the first lead post. The second lead is coupled to the second lead post. The first die is attached to the second surface of the die pad. The second die is attached to the second surface of the first lead post. The mold material encapsulates at least portions of the die pad, the first lead post, the second lead post, the first die, and the second die such that the first surface of the die pad and the first surface of the first lead post are exposed. The first surface of the die pad and the first surface of the first lead post are coplanar.

One example of a method for fabricating a semiconductor package includes attaching a first die to a die pad of a lead frame and attaching a second die to a first lead post of the lead frame. The method includes wire bonding the first die to a second lead post of the lead frame, the second lead post in a different plane than the first lead post. The method includes encapsulating at least portions of the lead frame, the first die, and the second die with a mold material such that coplanar surfaces of the die pad and the first lead post remain exposed.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Disclosed herein are lead frames and semiconductor packages utilizing the lead frames for multiple die packages (e.g., high power packages). The semiconductor packages include lead posts in different planes, where at least one lead post of each semiconductor package is exposed to the environment and acts as a heat sink. The lead frames and semiconductor packages disclosed herein may enable increased configurations and/or performance while simplifying the assembly process.

As used herein, the term "lead post" refers to a portion of a lead frame that is to be at least partially encapsulated by a mold material and that is coupled to a lead or multiple leads that are not to be encapsulated by the mold material. A lead post may also be referred to as an inner lead. A lead post coupled to multiple leads may be referred to as a fused lead post.

Figure 1A:
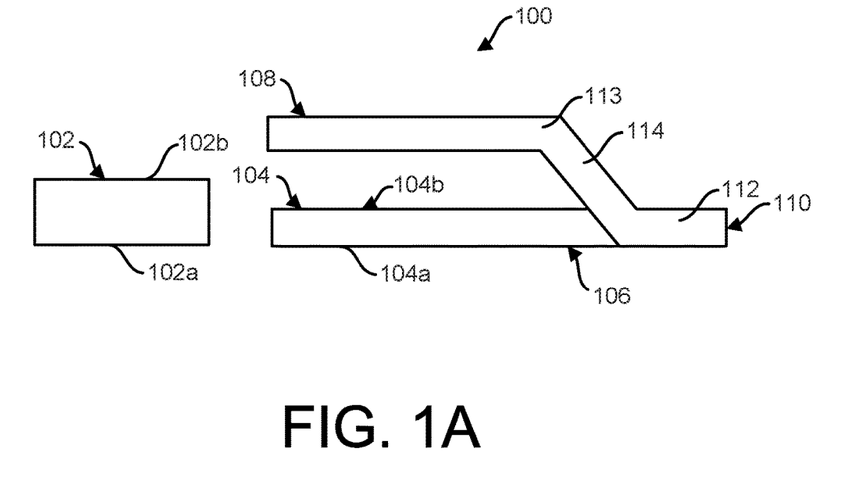
FIGS. 1A-1B illustrate one example of a lead frame for bottom side cooling.
Figure 1B:
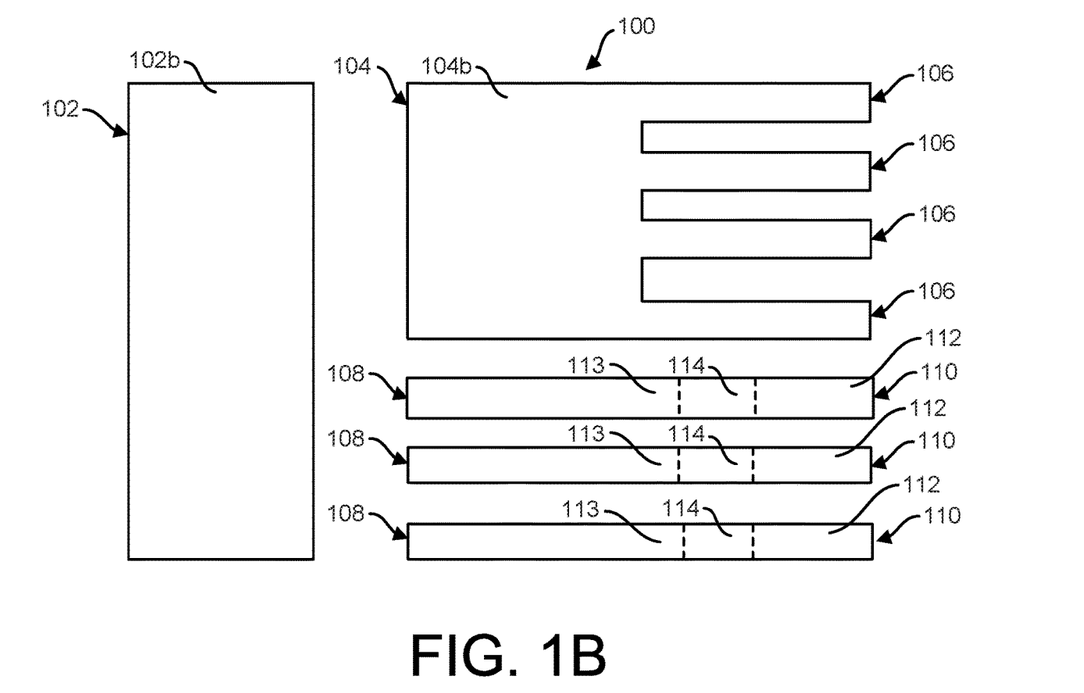

FIG. 1A is a side view and FIG. 1B is a top view illustrating one example of a lead frame 100 for bottom side cooling. Lead frame 100 includes a die pad 102, a first lead post 104, a plurality of first leads 106, a plurality of second lead posts 108, and a plurality of second leads 110. Lead frame 100 is made of a metal or has a metal surface, such as Ag, Cu, Ni/Pd/Au, NiNiP, or Ni/Pd/AuAg. The die pad 102 has a first surface 102a, which remains exposed to the environment when lead frame 100 is used in a semiconductor package. The die pad 102 has a second surface 102b opposite to the first surface 102a where a first die may be attached. The first lead post 104 has a first surface 104a coplanar with the surface 102a of the die pad 102. The first lead post 104 has a second surface 104b opposite to the first surface 104a where a second die may be attached. In one example, the thickness of the die pad 102 (between the first surface 102a and the second surface 102b) is greater than a thickness of the first lead post 104 (between the first surface 104*a* and the second surface 104*b*) as illustrated in FIG. 1A. In other examples, the die pad 102 and the first lead post 104 may have the same thickness.

The first lead post 104 is in a first plane. Each of the plurality of first leads 106 are coupled to the first lead post 104. While four first leads 106 are illustrated in FIG. 1B, in other examples, lead frame 100 may include less than four first leads 106 or more than four first leads 106. Each of the plurality of second lead posts 108 are in a second plane different from the first plane. In this example, the plurality of second lead posts 108 are in a second plane above the first plane of the first lead post 104 as illustrated in FIG. 1A.

Each of the plurality of second leads 110 are coupled to a corresponding second lead post 108. While three second lead posts 108 and three corresponding second leads 110 are illustrated in FIG. 1B, in other examples, lead frame 100 may include less than three second lead posts 108 and corresponding second leads 110 or more than three lead posts 108 and corresponding second leads 110. In other examples, a second lead post 108 may be similar to first lead post 104 in that a plurality of second leads 110 may be coupled to a single second lead post 108. In this example, the each of the plurality of first leads 106 are in the first plane and aligned with the first lead post 104. Each of the plurality of second leads 110 are shaped such that each of the plurality of second leads 110 includes a first portion 112 in the first plane, a second portion 113 in the second plane, and a third portion 114 extending between the first portion 112 and the second portion 113.

While in FIGS. 1A and 1B, the first leads 106 and the second leads 110 are illustrated as terminating at the same line, in other examples the first leads 106 and the second leads 110 may terminate at different positions (e.g., at two different lines). In one example, the first leads 106 may be shorter (e.g., to extend a shorter distance out of a package), while the second leads 110 may be longer (e.g., gull wing leads). This arrangement of the first leads 106 and the second leads 110 may provide the benefit of easier soldering for the different leads at different lines.

Figure 2A:
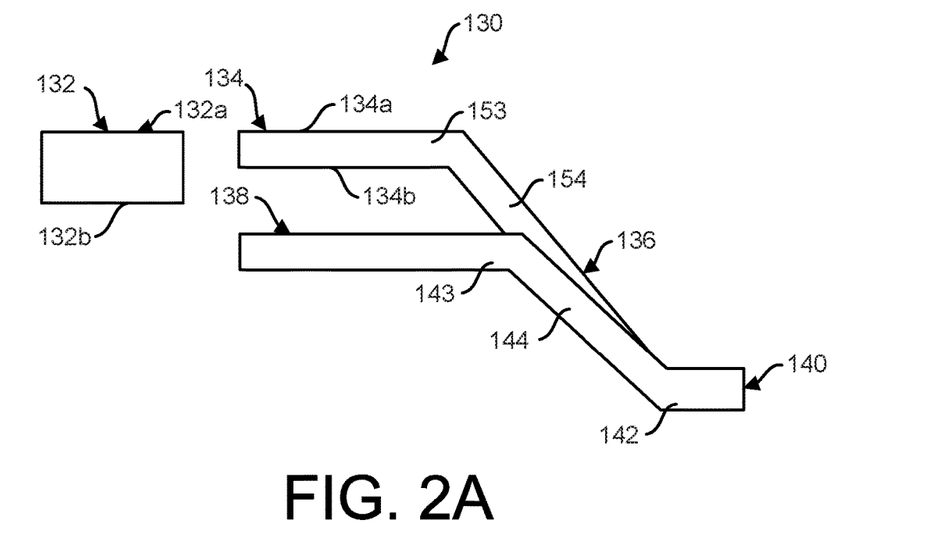
FIGS. 2A-2B illustrate one example of a lead frame for top side cooling.
Figure 2B:
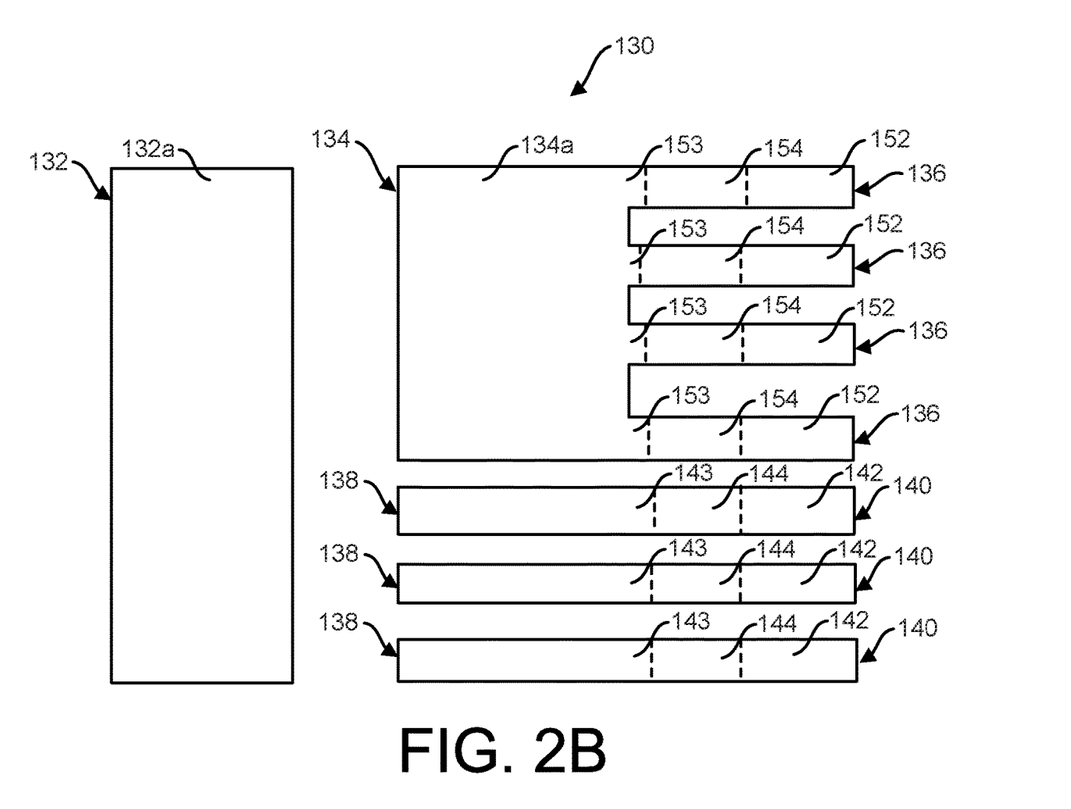

FIG. 2A is a side view and FIG. 2B is a top view illustrating one example of a lead frame 130 for top side cooling. Lead frame 130 includes a die pad 132, a first lead post 134, a plurality of first leads 136, a plurality of second lead posts 138, and a plurality of second leads 140. Lead frame 130 is made of a metal or has a metal surface, such as Ag, Cu, Ni/Pd/Au, NiNiP, or Ni/Pd/AuAg. The die pad 132 has a first surface 132*a*, which remains exposed to the environment when lead frame 130 is used in a semiconductor package. The die pad 132 has a second surface 132*b* opposite to the first surface 132*a* where a first die may be attached. The first lead post 134 has a surface 134*a* coplanar with the surface 132*a* of the die pad 132. The first lead post 134 has a second surface 134*b* opposite to the first surface 134*a* where a second die may be attached. In one example, the thickness of the die pad 132 (between the first surface 132*a* and the second surface 132*b*) is greater than a thickness of the first lead post 134 (between the first surface 134*a* and the second surface 134*b*) as illustrated in FIG. 2A. In other examples, the die pad 132 and the first lead post 134 may have the same thickness.

The first lead post 134 is in a first plane. Each of the plurality of first leads 136 are coupled to the first lead post 134. While four first leads 136 are illustrated in FIG. 2B, in other examples, lead frame 130 may include less than four first leads 136 or more than four first leads 136. Each of the plurality of second lead posts 138 are in a second plane different from the first plane. In this example, the plurality of second lead posts 138 are in a second plane below the first plane of the first lead post 134 as illustrated in FIG. 2A.

Each of the plurality of second leads 140 are coupled to a corresponding second lead post 138. While three second lead posts 138 and three corresponding second leads 140 are illustrated in FIG. 2B, in other examples, lead frame 130 may include less than three second lead posts 138 and corresponding second leads 140 or more than three lead posts 138 and corresponding second leads 140. In other examples, a second lead post 138 may be similar to first lead post 134 in that a plurality of second leads 140 may be coupled to a single second lead post 138. In this example, each of the plurality of first leads 136 are shaped such that each of the plurality of first leads 136 includes a first portion 152 in a third plane different from the first plane and the second plane, a second portion 153 in the first plane, and a third portion 154 extending between the first portion 152 and the second portion 153. The second plane is between the first plane and the third plane. In this example, the third plane is below the first plane and the second plane as illustrated in FIG. 2A. Each of the plurality of second leads 140 are shaped such that each of the plurality of second leads 140 includes a first portion 142 in the third plane, a second portion 143 in the second plane, and a third portion 144 extending between the first portion 142 and the second portion 143.

A skilled person in the art should understand, in the embodiments of FIGS. 1A, 1B, 2A, 2B and other embodiments, although the first leads and the second leads are shown in three-dimensional (3D) shape, e.g., the first lead 136 and the second lead 140 of FIG. 2A are shown having bended portions 154 and 144, respectively, which may be shaped during bending and forming processes of making a semiconductor package, it is still possible that during the manufacturing process of the lead frame, especially as the outcome of this manufacturing process, each first lead and each second lead may be in a planar shape, which is also covered by embodiments of this disclosure.

Figure 3A:
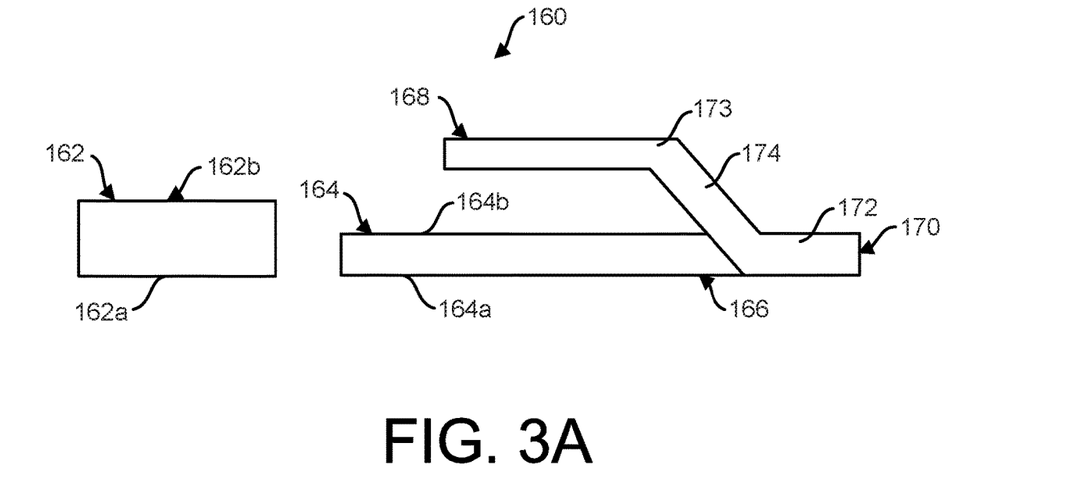
FIGS. 3A-3B illustrate another example of a lead frame for bottom side cooling.
Figure 3B:
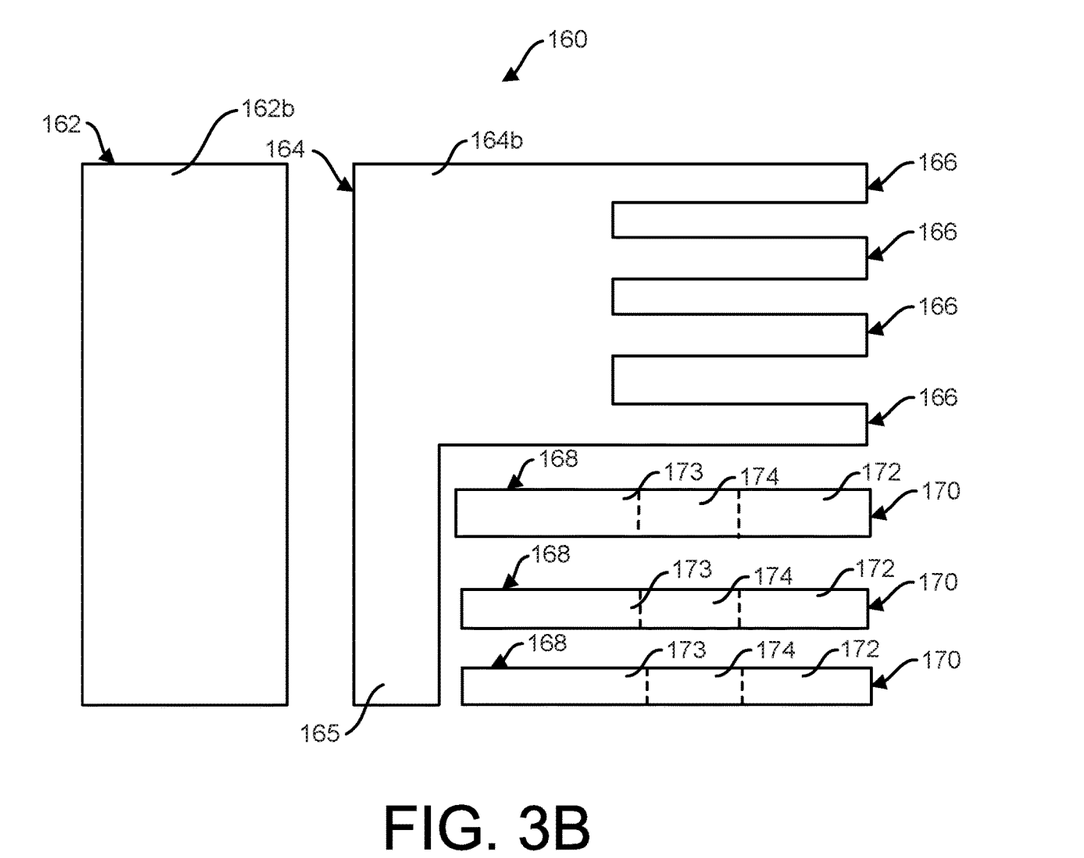

FIG. 3A is a side view and FIG. 3B is a top view illustrating another example of a lead frame 160 for bottom side cooling. Lead frame 160 includes a die pad 162, a first lead post 164, a plurality of first leads 166, a plurality of second lead posts 168, and a plurality of second leads 170. Lead frame 160 is made of a metal or has a metal surface, such as Ag, Cu, Ni/Pd/Au, NiNiP, or Ni/Pd/AuAg. The die pad 162 has a first surface 162*a*, which remains exposed to the environment when lead frame 160 is used in a semiconductor package. The die pad 162 has a second surface 162*b* opposite to the first surface 162*a* where a first die may be attached. The first lead post 164 has a first surface 164*a* coplanar with the surface 162*a* of the die pad 162. The first lead post 164 has a second surface 164*b* opposite to the first surface 164*a* where a second die may be attached. In one example, the thickness of the die pad 162 (between the first surface 162*a* and the second surface 162*b*) is greater than a thickness of the first lead post 164 (between the first surface 164*a* and the second surface 164*b*) as illustrated in FIG. 3A. In other examples, the die pad 162 and the first lead post 164 may have the same thickness.

The first lead post 164 is in a first plane. Each of the plurality of first leads 166 are coupled to the first lead post 164. While four first leads 166 are illustrated in FIG. 3B, in other examples, lead frame 160 may include less than four first leads 166 or more than four first leads 166. In this example, first lead post 164 includes an extended portion 165 arranged adjacent to each of the plurality of second lead posts 168 (e.g., an inner end of each second lead post 168), such that the first lead post 164 is L-shaped. While in the example illustrated in FIG. 3B, the extended portion 165 overlaps each of the plurality of second lead posts 168, in other examples the extended portion 165 may overlap a portion of the plurality of second lead posts 168, such as one second lead post 168 or two second lead posts 168. Each of the plurality of second lead posts 168 are in a second plane different from the first plane. In this example, the plurality of second lead posts 168 are in a second plane above the first plane of the first lead post 164 as illustrated in FIG. 3A. In this example, a larger lead post 164 may have a better heat dissipation performance, especially when it is exposed. A skilled person also should understand it is also possible that the extended portion 165 does not overlap with the second leads 170, especially when the second leads 170 are far away and there is a big gap from the die pad 162.

Each of the plurality of second leads 170 are coupled to a corresponding second lead post 168. While three second lead posts 168 and three corresponding second leads 170 are illustrated in FIG. 3B, in other examples, lead frame 160 may include less than three second lead posts 168 and corresponding second leads 170 or more than three lead posts 168 and corresponding second leads 170. In other examples, a second lead post 168 may be similar to first lead post 164 in that a plurality of second leads 170 may be coupled to a single second lead post 168. In this example, each of the plurality of first leads 166 are in the first plane and aligned with the first lead post 164. Each of the plurality of second leads 170 are shaped such that each of the plurality of second leads 170 includes a first portion 172 in the first plane, a second portion 173 in the second plane, and a third portion 174 extending between the first portion 172 and the second portion 173.

Figure 4A:
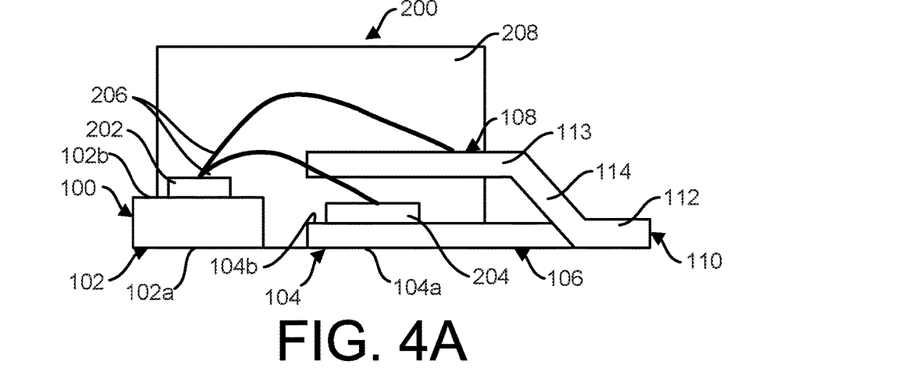
FIGS. 4A-4D illustrate one example of a semiconductor package for bottom side cooling.
Figure 4B:
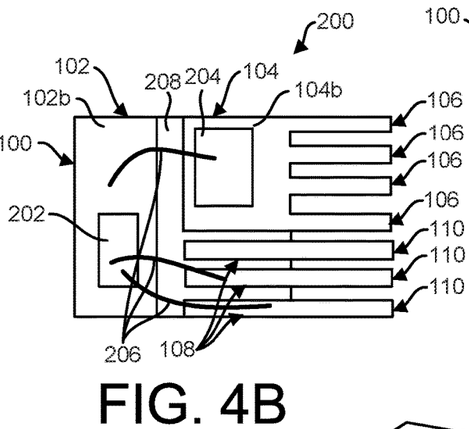
Figure 4C:
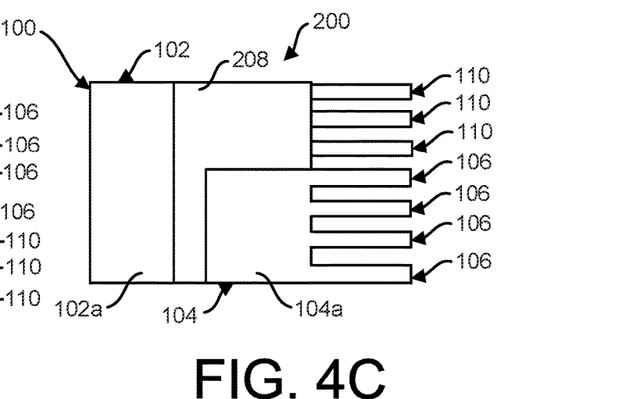
Figure 4D:
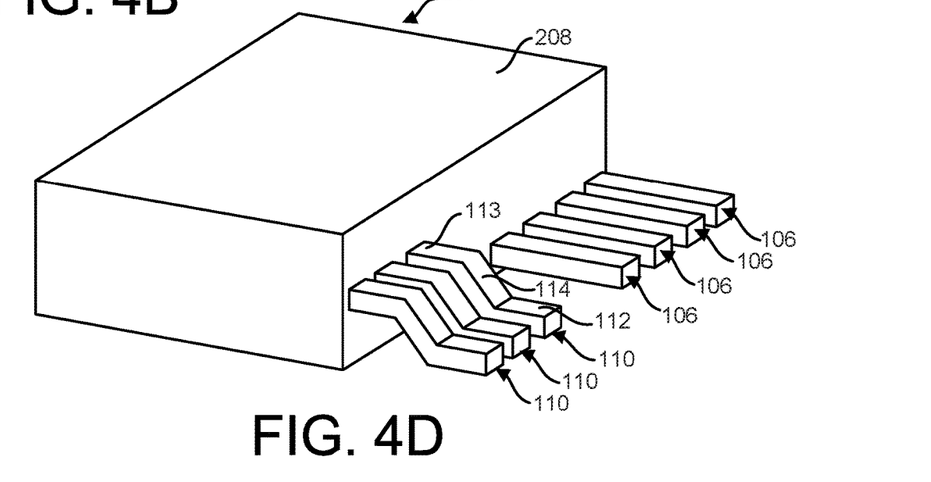

FIG. 4A is a side view, FIG. 4B is a top view, FIG. 4C is a bottom view, and FIG. 4D is a perspective view illustrating one example of a semiconductor package 200 for bottom side cooling. Semiconductor package 200 includes a lead frame 100 as previously described and illustrated with reference to FIGS. 1A-1B, a first die 202, a second die 204, bond wires 206, and a mold material 208. As previously described, lead frame 100 of semiconductor package 200 includes a die pad 102, a first lead post 104, a plurality of first leads 106, a plurality of second lead posts 108, and a plurality of second leads 110. Die pad 102 has a first surface 102a and a second surface 102b opposite to the first surface 102a of the die pad 102. The first lead post 104 has a first surface 104a and a second surface 104b opposite to the first surface 104a of the first lead post 104. Each of the plurality of first leads 106 is coupled to the first lead post 104. Each of the plurality of second leads 110 is coupled to a corresponding second lead post 108.

The first die 202 is attached to the second surface 102b of the die pad 102. The die pad 102 acts as a heat sink for first die 202. The second die 204 is attached to the second surface 104b of the first lead post 104. The first lead post 104 acts as a heat sink for second die 204. In one example, the first die 202 may be attached to die pad 102 and the second die 204 may be attached to the first lead post 104 via solder, an adhesive material, or another suitable material. The first die 202 and the second die 204 may be electrically coupled to each other and/or to lead frame 100 (e.g., to die pad 102 and second lead posts 108) via bond wires 206. In one example, the first die 202 may be a transistor die and the second die 204 may be a diode die. In another example, the first die 202 may be a transistor die and the second die 204 may be gate driver die. In other examples, the first die 202 and the second die 204 may be other suitable dies.

Mold material 208 encapsulates at least portions of the die pad 102, the first lead post 104, the plurality of second lead posts 108, the first die 202, the second die 204, and the bond wires 206 such that the first surface 102a of the die pad 102 and the first surface 104a of the first lead post 104 are exposed. Mold material 208 may include an epoxy or another suitable dielectric material. The first surface 102a of the die pad 102 and the first surface 104a of the first lead post 104 are coplanar. The first lead post 104 and the plurality of second lead posts 108 are in different planes. In this example, each of the plurality of first leads 106 are coplanar with the first lead post 104. Each of the plurality of second leads 110 are shaped such that each of the plurality of second leads 110 includes a first portion 112 coplanar with the first lead post 104, a second portion 113 coplanar with the plurality of second lead posts 108, and a third portion 114 extending between the first portion 112 and the second portion 113.

Figure 5A:
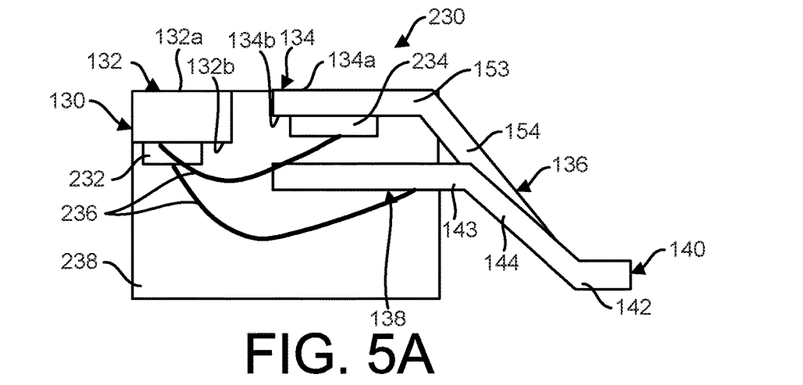
FIGS. 5A-5D illustrate one example of a semiconductor package for top side cooling.
Figure 5B:
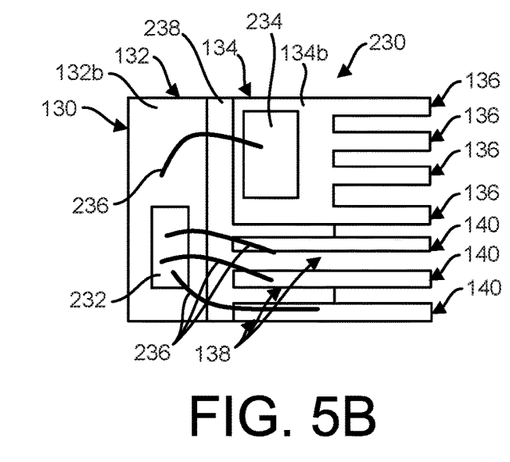
Figure 5C:
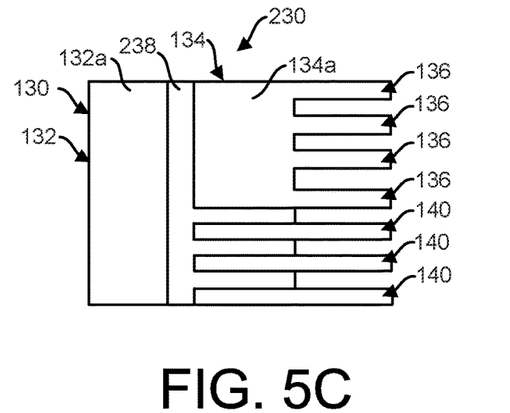
Figure 5D:
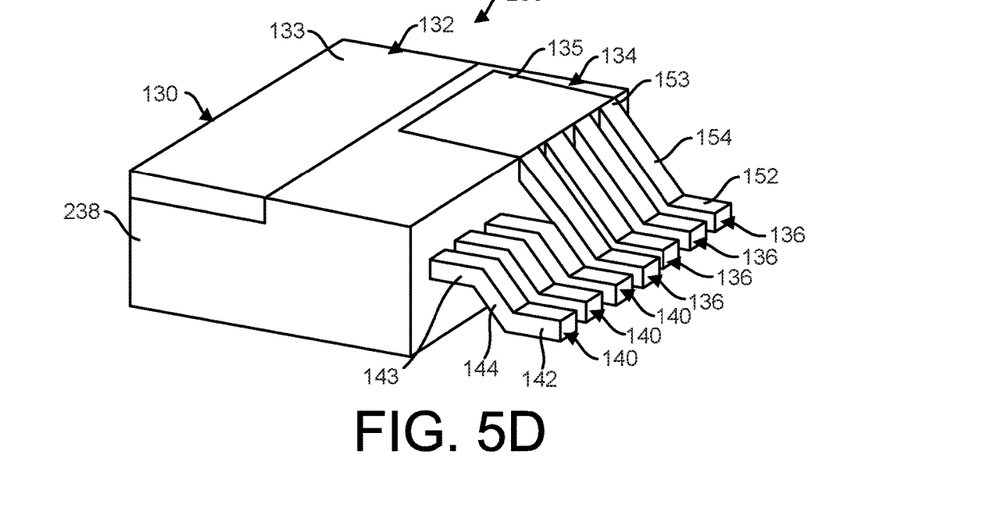

FIG. 5A is a side view, FIG. 5B is a bottom view, FIG. 5C is a top view, and FIG. 5D is a perspective view illustrating one example of a semiconductor package 230 for top side cooling. Semiconductor package 230 includes a lead frame 130 as previously described and illustrated with reference to FIGS. 2A-2B, a first die 232, a second die 234, bond wires 236, and a mold material 238. As previously described, lead frame 130 of semiconductor package 230 includes a die pad 132, a first lead post 134, a plurality of first leads 136, a plurality of second lead posts 138, and a plurality of second leads 140. Die pad 132 has a first surface 132a and a second surface 132b opposite to the first surface 132a of the die pad 132. The first lead post 134 has a first surface 134a and a second surface 134b opposite to the first surface 134a of the first lead post 134. Each of the plurality of first leads 136 is coupled to the first lead post 134. Each of the plurality of second leads 140 is coupled to a corresponding second lead post 138.

The first die 232 is attached to the second surface 132b of the die pad 132. The die pad 132 acts as a heat sink for first die 232. The second die 234 is attached to the second surface 134b of the first lead post 134. The first lead post 134 acts as a heat sink for second die 234. In one example, the first die 232 may be attached to die pad 132 and the second die 234 may be attached to the first lead post 134 via solder, an adhesive material, or another suitable material. The first die 232 and the second die 234 may be electrically coupled to each other and/or to lead frame 130 (e.g., to die pad 132 and second lead posts 138) via bond wires 236. In one example, the first die 232 may be a transistor die and the second die 234 may be a diode die. In another example, the first die 232 may be a transistor die and the second die 234 may be gate driver die. In other examples, the first die 232 and the second die 234 may be other suitable dies.

Mold material 238 encapsulates at least portions of the die pad 132, the first lead post 134, the plurality of second lead posts 138, the first die 232, the second die 234, and the bond wires 236 such that the first surface 132a of the die pad 132 and the first surface 134a of the first lead post 134 are exposed. Mold material 238 may include an epoxy or another suitable dielectric material. The first surface 132a of the die pad 132 and the first surface 134a of the first lead post 134 are coplanar. The first lead post 134 and the plurality of second lead posts 138 are in different planes. In this example, each of the plurality of first leads 136 are shaped such that each of the plurality of first leads 136 intersects a plane in which the plurality of second lead posts 138 are arranged.

Figure 6A:
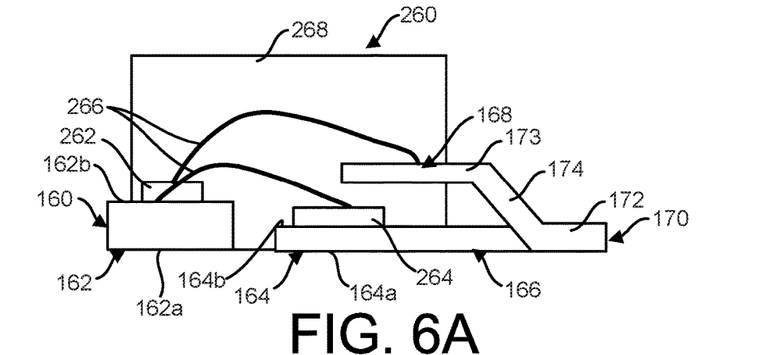
FIGS. 6A-6D illustrate another example of a semiconductor package for bottom side cooling.
Figure 6B:
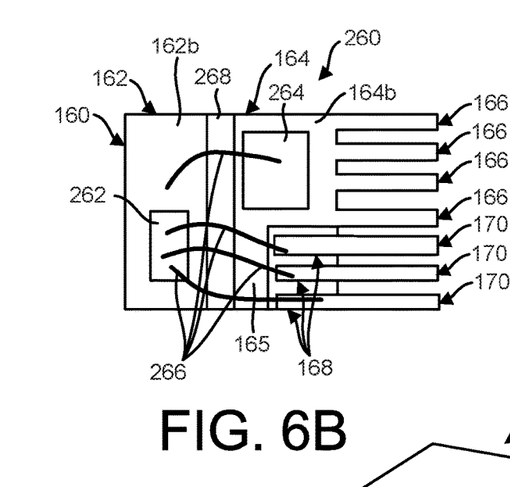
Figure 6C:
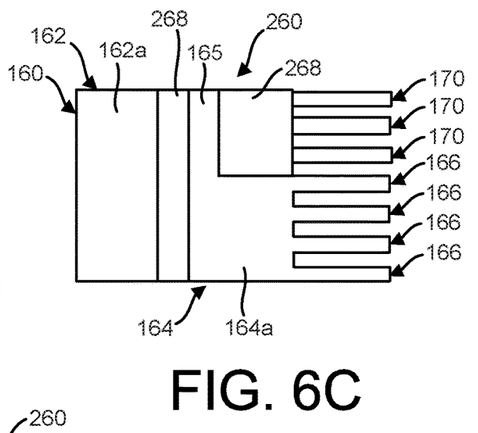
Figure 6D:
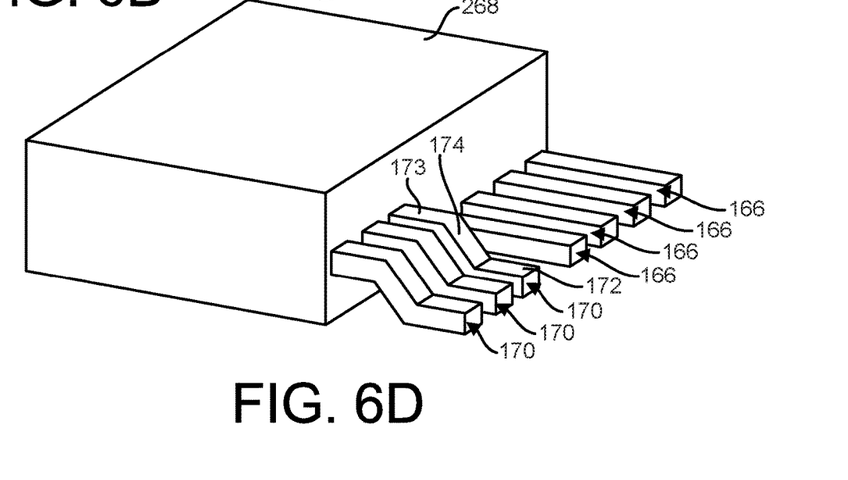

FIG. 6A is a side view, FIG. 6B is a top view, FIG. 6C is a bottom view, and FIG. 6D is a perspective view illustrating another example of a semiconductor package 260 for bottom side cooling. Semiconductor package 260 includes a lead frame 160 as previously described and illustrated with reference to FIGS. 3A-3B, a first die 262, a second die 264, bond wires 266, and a mold material 268. As previously described, lead frame 160 of semiconductor package 260 includes a die pad 162, a first lead post 164 including an extended portion 165, a plurality of first leads 166, a plurality of second lead posts 168, and a plurality of second leads 170. Die pad 162 has a first surface 162a and a second surface 162b opposite to the first surface 162a of the die pad 162. The first lead post 164 has a first surface 164a and a second surface 164b opposite to the first surface 164a of the first lead post 164. Each of the plurality of first leads 166 is coupled to the first lead post 164. Each of the plurality of second leads 170 is coupled to a corresponding second lead post 168.

The first die 262 is attached to the second surface 162b of the die pad 162. The die pad 162 acts as a heat sink for first die 262. The second die 264 is attached to the second surface 164b of the first lead post 164. The first lead post 164 acts as a heat sink for second die 264. In one example, the first die 262 may be attached to die pad 162 and the second die 264 may be attached to the first lead post 164 via solder, an adhesive material, or another suitable material. The first die 262 and the second die 264 may be electrically coupled to each other and/or to lead frame 160 (e.g., to die pad 162 and second lead posts 168) via bond wires 266. In one example, the first die 262 may be a transistor die and the second die 264 may be a diode die. In another example, the first die 262 may be a transistor die and the second die 264 may be gate driver die. In other examples, the first die 262 and the second die 264 may be other suitable dies.

Mold material 268 encapsulates at least portions of the die pad 162, the first lead post 164, the plurality of second lead posts 168, the first die 262, the second die 264, and the bond wires 266 such that the first surface 162a of the die pad 162 and the first surface 164a of the first lead post 164 are exposed. Mold material 268 may include an epoxy or another suitable dielectric material. The first surface 162a of the die pad 162 and the first surface 164a of the first lead post 164 are coplanar. The first lead post 164 and the plurality of second lead posts 168 are in different planes. In this example, each of the plurality of first leads 166 are coplanar with the first lead post 164. Each of the plurality of second leads 170 are shaped such that each of the plurality of second leads 170 includes a first portion 172 coplanar with the first lead post 164, a second portion 173 coplanar with the plurality of second lead posts 168, and a third portion 174 extending between the first portion 172 and the second portion 173.

Figure 7A:
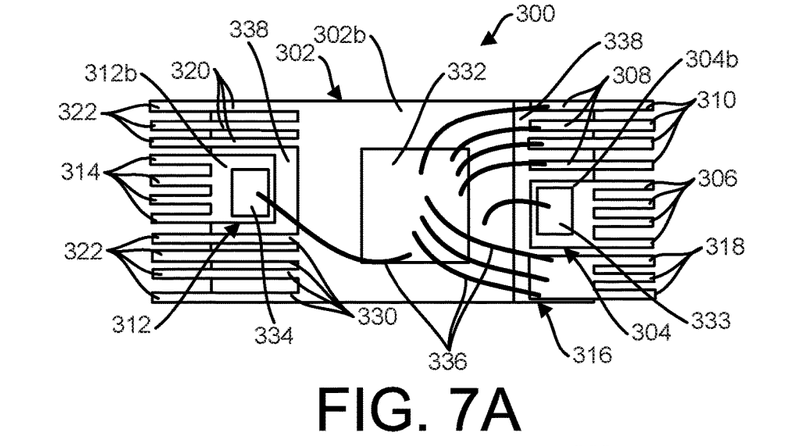
FIGS. 7A-7C illustrate another example of a semiconductor package for top side cooling.
Figure 7B:
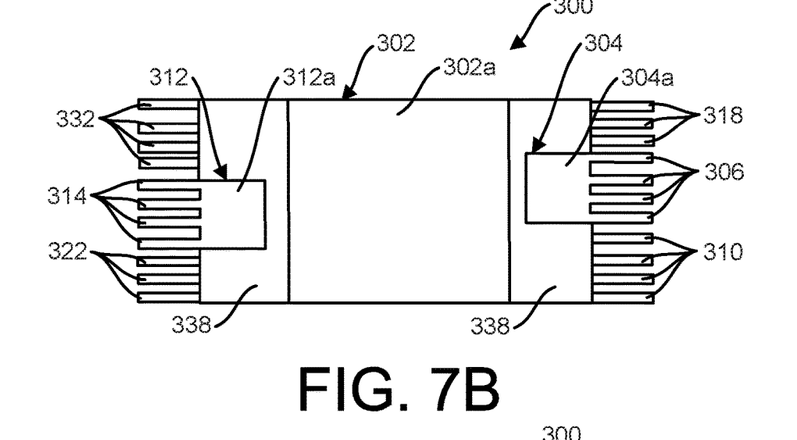
Figure 7C:
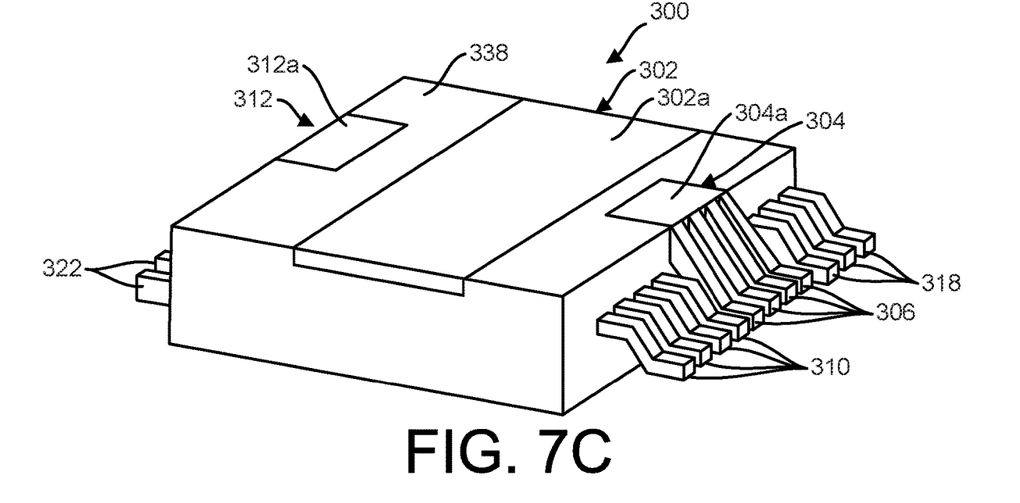

FIG. 7A is a bottom view, FIG. 7B is a top view, and FIG. 7C is a perspective view illustrating another example of a semiconductor package 300 for top side cooling. Semiconductor package 300 includes a lead frame including a die pad 302, a first lead post 304, a plurality of first leads 306, a plurality of second lead posts 308, a plurality of second leads 310, a third lead post 312, a plurality of third leads 314, a fourth lead post 316, a plurality of fourth leads 318, a plurality of fifth lead posts 320, and a plurality of fifth leads 322. Semiconductor device 300 also includes a first die 332, a second die 333, a third die 334, bond wires 236, and a mold material 338.

Die pad 302 has a first surface 302a and a second surface 302b opposite to the first surface 302a. The first lead post 304 has a first surface 304a and a second surface 304b opposite to the first surface 304a. Each of the plurality of first leads 306 is coupled to the first lead post 304. Each of the plurality of second leads 310 is coupled to a corresponding second lead post 308. The third lead post 312 has a first surface 312a and a second surface 312b opposite to the first surface 312a. Each of the plurality of third leads 314 are coupled to the third lead post 312. Each of the plurality of fourth leads 318 is coupled to the fourth lead post 316. Each of the plurality of fifth lead posts 320 is coupled to die pad 302, and each of the plurality of fifth leads 322 is coupled to a corresponding fifth lead post 320.

The first die 332 is attached to the second surface 302b of the die pad 302. The die pad 302 acts as a heat sink for first die 332. The second die 333 is attached to the second surface 304b of the first lead post 304. The first lead post 304 acts as a heat sink for second die 333. The third die 334 is attached to the second surface 312b of the third lead post 312. The third lead post 312 acts as a heat sink for third die 334. In one example, the first die 332 may be attached to die pad 332, the second die 333 may be attached to the first lead post 304, and the third die 334 may be attached to the third lead post 312 via solder, an adhesive material, or another suitable material. The first die 332, the second die 333, and the third die 334 may be electrically coupled to each other and/or to the lead frame (e.g., to die pad 302, second lead posts 308, and fourth lead post 316) via bond wires 336. In one example, the first die 332 may be a transistor die, the second die 333 may be a diode die, and the third die 334 may be a gate driver die. In other examples, the first die 332, the second die 333, and the third die 334 may be other suitable dies.

Mold material 338 encapsulates at least portions of the die pad 302, the first lead post 304, the plurality of second lead posts 308, the third lead post 312, the fourth lead post 316, the plurality of fifth lead posts 320, the first die 332, the second die 333, the third die 334, and the bond wires 336 such that the first surface 302a of the die pad 302, the first surface 304a of the first lead post 304, and the first surface 312a of the third lead post 312 are exposed. Mold material 338 may include an epoxy or another suitable dielectric material. The first surface 302a of the die pad 302, the first surface 304a of the first lead post 304, and the first surface 312a of the third lead post 312 are coplanar. The first lead post 304 and the third lead post 312 are in a different plane from and the plurality of second lead posts 308 and the fourth lead post 316. In this example, the first lead post 304 is arranged on a first side of the die pad 302 and the third lead post 312 is arranged on a second side of the die pad 302 opposite to the first side of the die pad 302. In other examples, the first lead post 304 and the third lead post 312 may be arranged on the same side of the die pad 302.

Figure 8A:
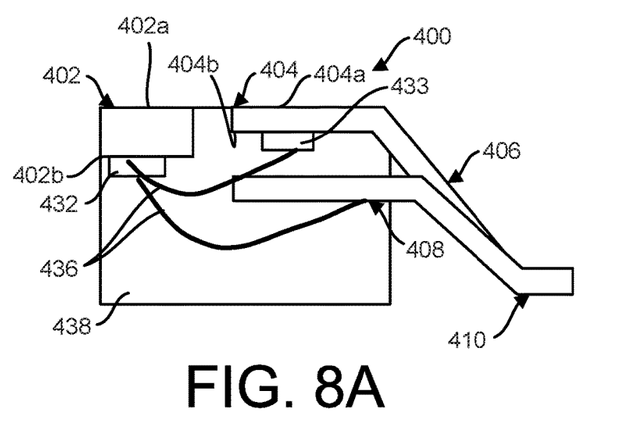
FIGS. 8A-8D illustrate another example of a semiconductor package for top side cooling.
Figure 8B:
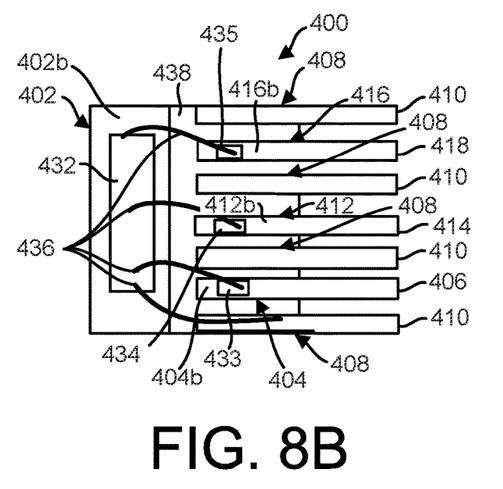
Figure 8C:
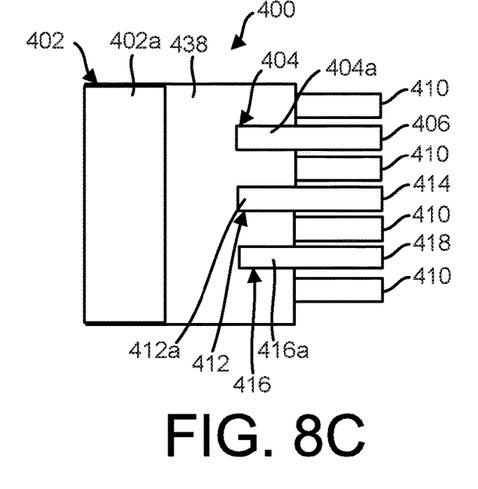
Figure 8D:
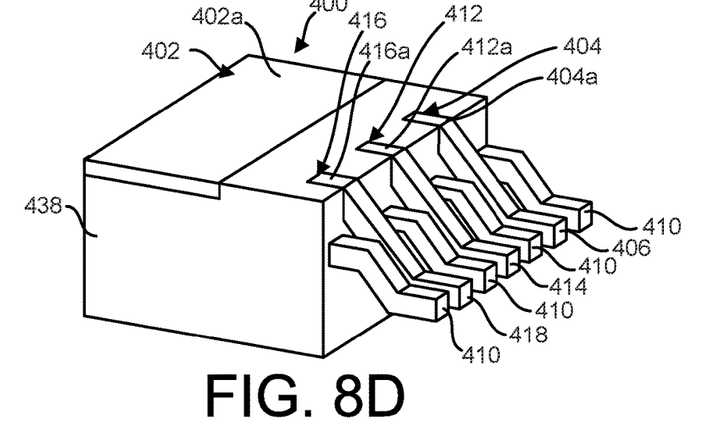

FIG. 8A is a side view, FIG. 8B is a bottom view, FIG. 8C is a top view, and FIG. 8D is a perspective view illustrating another example of a semiconductor package 400 for top side cooling. Semiconductor package 400 includes a lead frame including a die pad 402, a first lead post 404, a first lead 406, a plurality of second lead posts 408, a plurality of second leads 410, a third lead post 412, a third lead 414, a fourth lead post 416, and a fourth lead 418. Semiconductor device 400 also includes a first die 432, a second die 433, a third die 434, a fourth die 435, bond wires 436, and a mold material 438.

Die pad 402 has a first surface 402a and a second surface 402b opposite to the first surface 402a. The first lead post 404 has a first surface 404a and a second surface 404b opposite to the first surface 404a. The first lead 406 is coupled to the first lead post 404. Each of the plurality of second leads 410 is coupled to a corresponding second lead post 408. The third lead post 412 has a first surface 412a and a second surface 412b opposite to the first surface 412a. The third lead 414 is coupled to the third lead post 412. The fourth lead post 416 has a first surface 416a and a second surface 416b opposite to the first surface 416a. The fourth lead 418 is coupled to the fourth lead post 416.

The first die 432 is attached to the second surface 402b of the die pad 402. The die pad 402 acts as a heat sink for first die 432. The second die 433 is attached to the second surface 404b of the first lead post 404. The first lead post 404 acts as a heat sink for second die 433. The third die 434 is attached to the second surface 412b of the third lead post 412. The third lead post 412 acts as a heat sink for third die 434. The fourth die 435 is attached to the second surface 416b of the fourth lead post 416. The fourth lead post 416 acts as a heat sink for fourth die 435. In one example, the first die 432 may be attached to die pad 402, the second die 433 may be attached to the first lead post 404, the third die 434 may be attached to the third lead post 412, and the fourth die 435 may be attached to the fourth lead post 416 via solder, an adhesive material, or another suitable material. The first die 432, the second die 433, the third die 434, and the fourth die 435 may be electrically coupled to each other and/or to the lead frame (e.g., to second leads posts 408) via bond wires 436.

Mold material 438 encapsulates at least portions of the die pad 402, the first lead post 404, the plurality of second lead posts 408, the third lead post 412, the fourth lead post 416, the first die 432, the second die 433, the third die 434, the fourth die 435, and the bond wires 436 such that the first surface 402a of the die pad 402, the first surface 404a of the first lead post 404, the first surface 412a of the third lead post 412, and the first surface 416a of the fourth lead post 416 are exposed. Mold material 438 may include an epoxy or another suitable dielectric material. The first surface 402a of the die pad 402, the first surface 404a of the first lead post 404, the first surface 412a of the third lead post 412, and the first surface 416a of the fourth lead post 416 are coplanar. The first lead post 404, the third lead post 412, and the fourth lead post 416 are in a different plane from the plurality of second lead posts 408. In this example, a second lead 410 is between the first lead 406 and the third lead 414, and another second lead 410 is between the third lead 414 and the fourth lead 418.

Figure 9A:
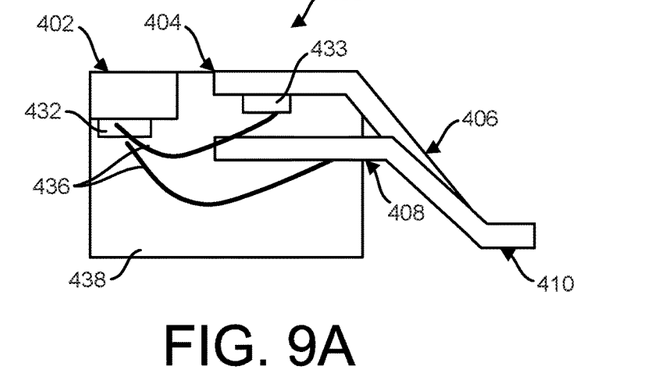
FIGS. 9A-9D illustrate another example of a semiconductor package for top side cooling.
Figure 9B:
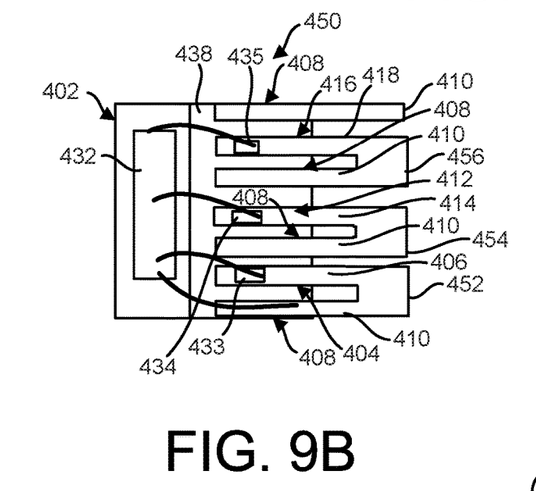
Figure 9C:
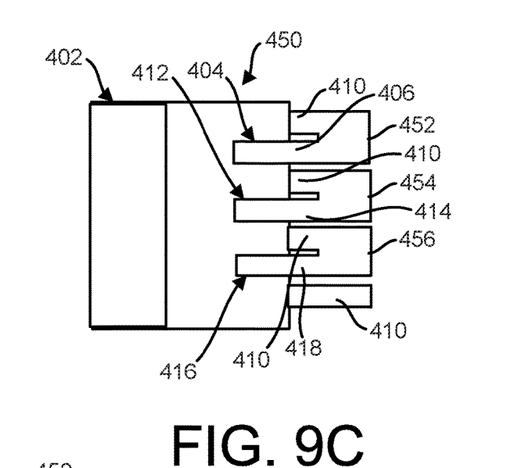
Figure 9D:
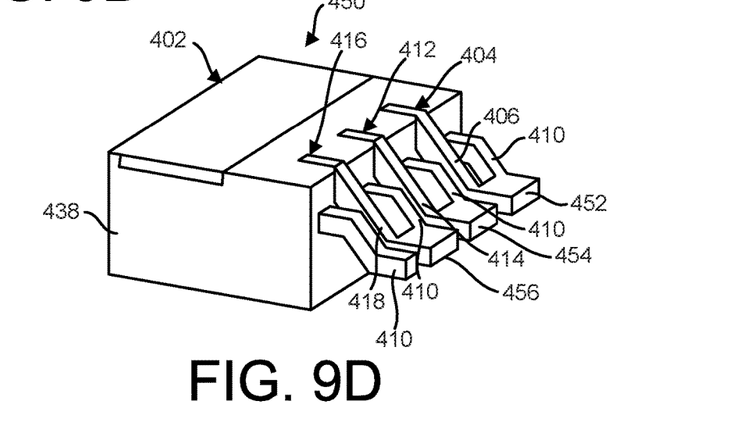

FIG. 9A is a side view, FIG. 9B is a bottom view, FIG. 9C is a top view, and FIG. 9D is a perspective view illustrating another example of a semiconductor package 450 for top side cooling. Semiconductor package 450 is similar to semiconductor package 400 previously described and illustrated with reference to FIGS. 8A-8D, except that in semiconductor package 450, the first lead 406 is coupled to a second lead 410 as indicated at 452, the third lead 414 is coupled to another second lead 410 as indicated at 454, and the fourth lead 418 is coupled to yet another second lead 410 as indicated at 456.

Figure 10A:
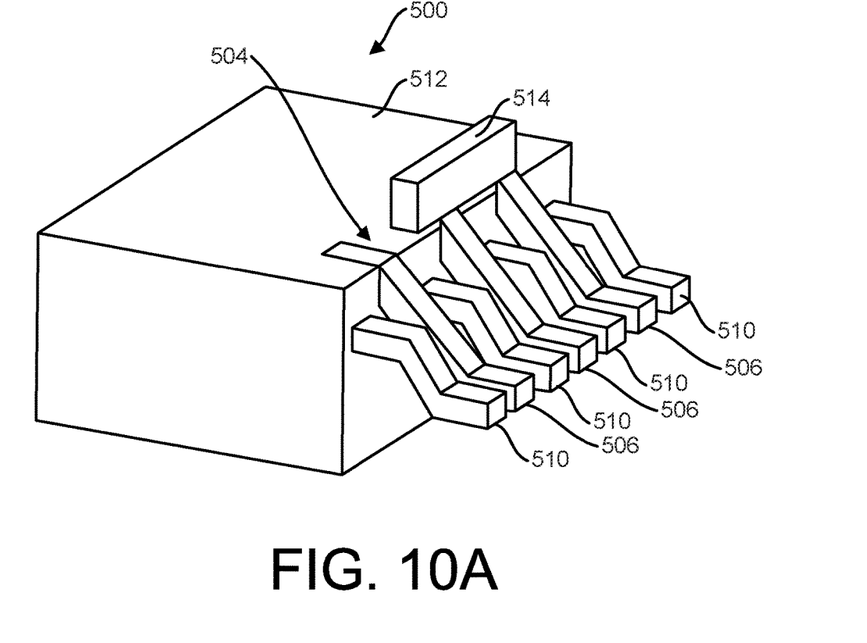
FIGS. 10A-10C illustrate one example of a semiconductor package for bottom side cooling and an additional component on the top side.
Figure 10B:
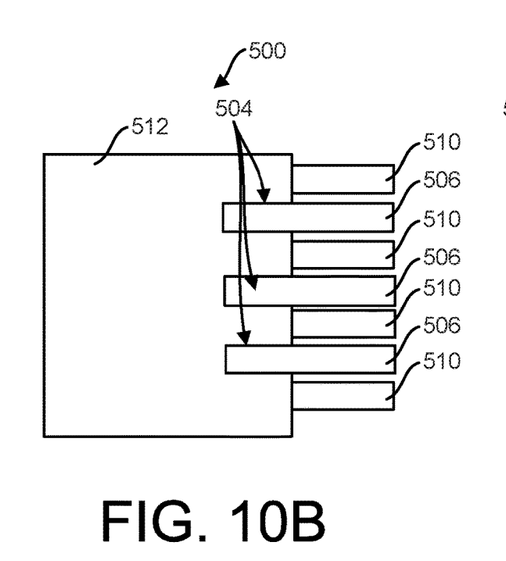
Figure 10C:
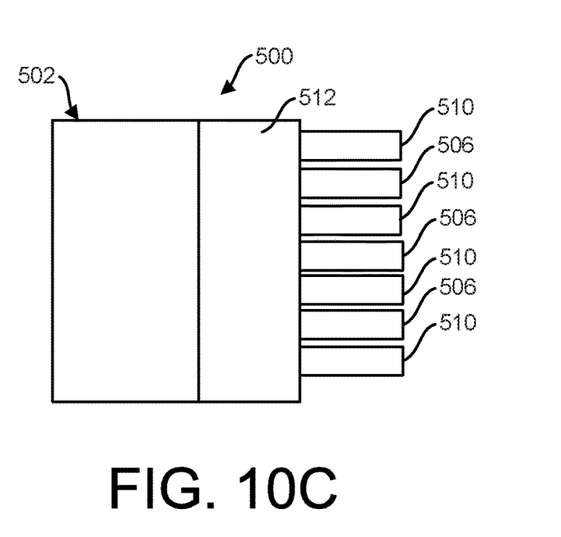

FIG. 10A is a perspective view, FIG. 10B is a top view, and FIG. 10C is a bottom view illustrating another example of a semiconductor package 500 for bottom side cooling. Semiconductor package 500 includes a lead frame including a die pad 502, a plurality of first lead posts 504, a plurality of first leads 506, a plurality of second lead posts (not shown), and a plurality of second leads 510. Semiconductor device 500 also includes a die (not shown) attached to die pad 502, a die (not shown) attached to at least one lead post coplanar with the die pad 502, and a mold material 512. The plurality of first lead posts 504 are in a different plane from the plurality of second lead posts.

Each of the plurality of first leads 506 is coupled to a corresponding first lead post 504. Each of the plurality of second leads 510 is coupled to a corresponding second lead post. In this example, each first lead post 504 and corresponding first lead 506 is arranged between two second lead posts and corresponding second leads 510. As shown in FIG. 10A, a leadless component 514 (e.g., a passive component) may be electrically coupled to one of the plurality of first lead posts 504 and another one of the plurality of first lead posts 504 such that the passive component 514 is electrically coupled between one of the plurality of first leads 506 and another one of the plurality of first leads 506, respectively.

Mold material 512 encapsulates at least portions of the die pad 502, the die, the plurality of first lead posts 504, and the plurality of second lead posts such that a surface of each of the plurality of first lead posts 504 and a surface of the die pad 502 are exposed. Mold material 512 may include an epoxy or another suitable dielectric material.

Figure 11A:
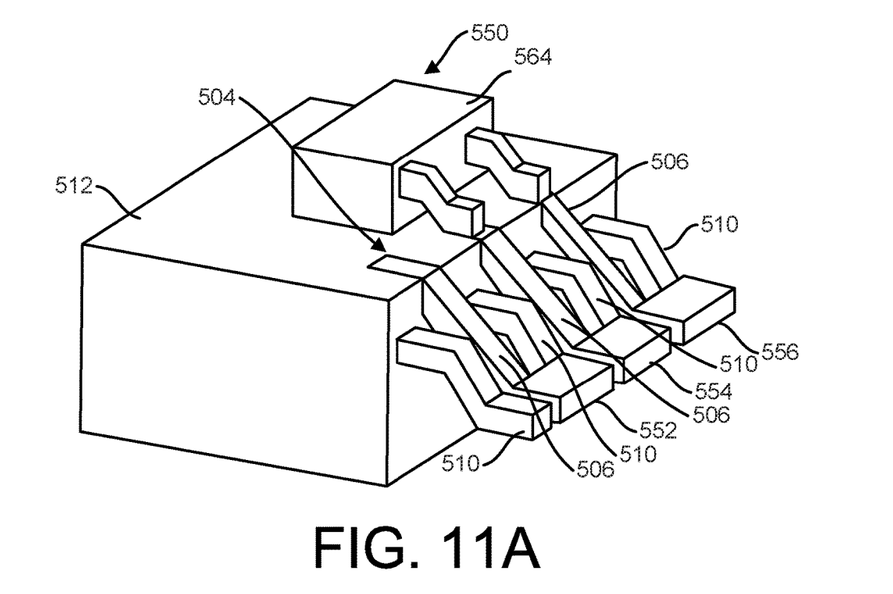
FIGS. 11A-11C illustrate another example of a semiconductor package for bottom side cooling and an additional component on the top side.
Figure 11B:
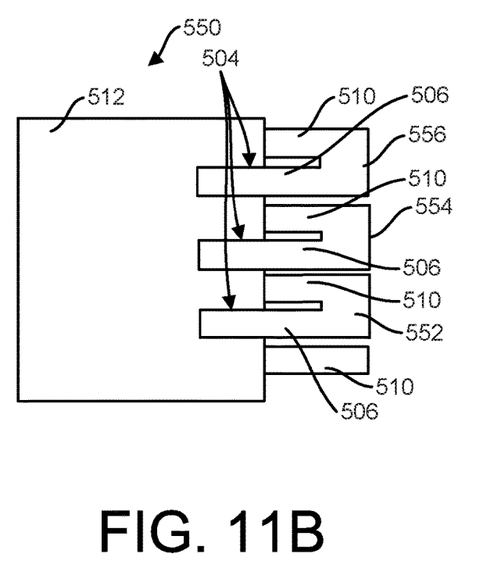
Figure 11C:
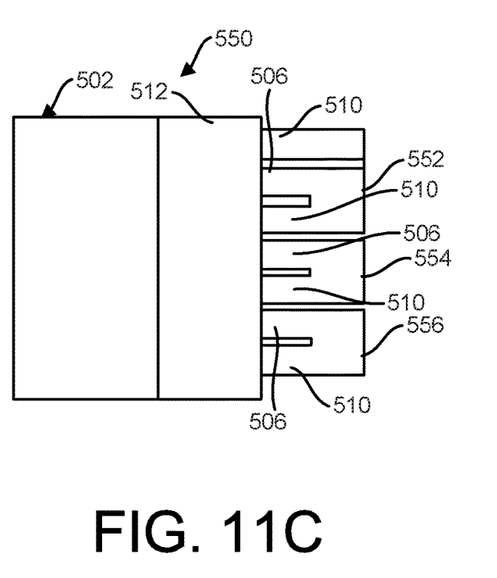

FIG. 11A is a perspective view, FIG. 11B is a top view, and FIG. 11C is a bottom view illustrating another example of a semiconductor package 550 for bottom side cooling. Semiconductor package 550 is similar to semiconductor package 500 previously described and illustrated with reference to FIGS. 10A-10C, except that in semiconductor package 550, each of the first leads 506 is coupled to a second lead 510 as indicated at 552, 554, and 556. In this example, a leaded component 564 (e.g., a passive component) may be electrically coupled to one of the plurality of first lead posts 504 and another one of the plurality of first lead posts 504 such that the passive component 564 is electrically coupled between one of the plurality of first leads 506 and another one of the plurality of first leads 506, respectively.

FIGS. 12A-12E are flow diagrams illustrating one example of a method 600 for fabricating a semiconductor package. In one example, method 600 may be used to fabricate semiconductor package 200 of FIGS. 4A-4D, semiconductor package 230 of FIGS. 5A-5D, semiconductor package 260 of FIGS. 6A-6D, semiconductor package 300 of FIGS. 7A-7C, semiconductor package 400 of FIGS. 8A-8D, and/or semiconductor package 450 of FIGS. 9A-9D.

Figure 12A:
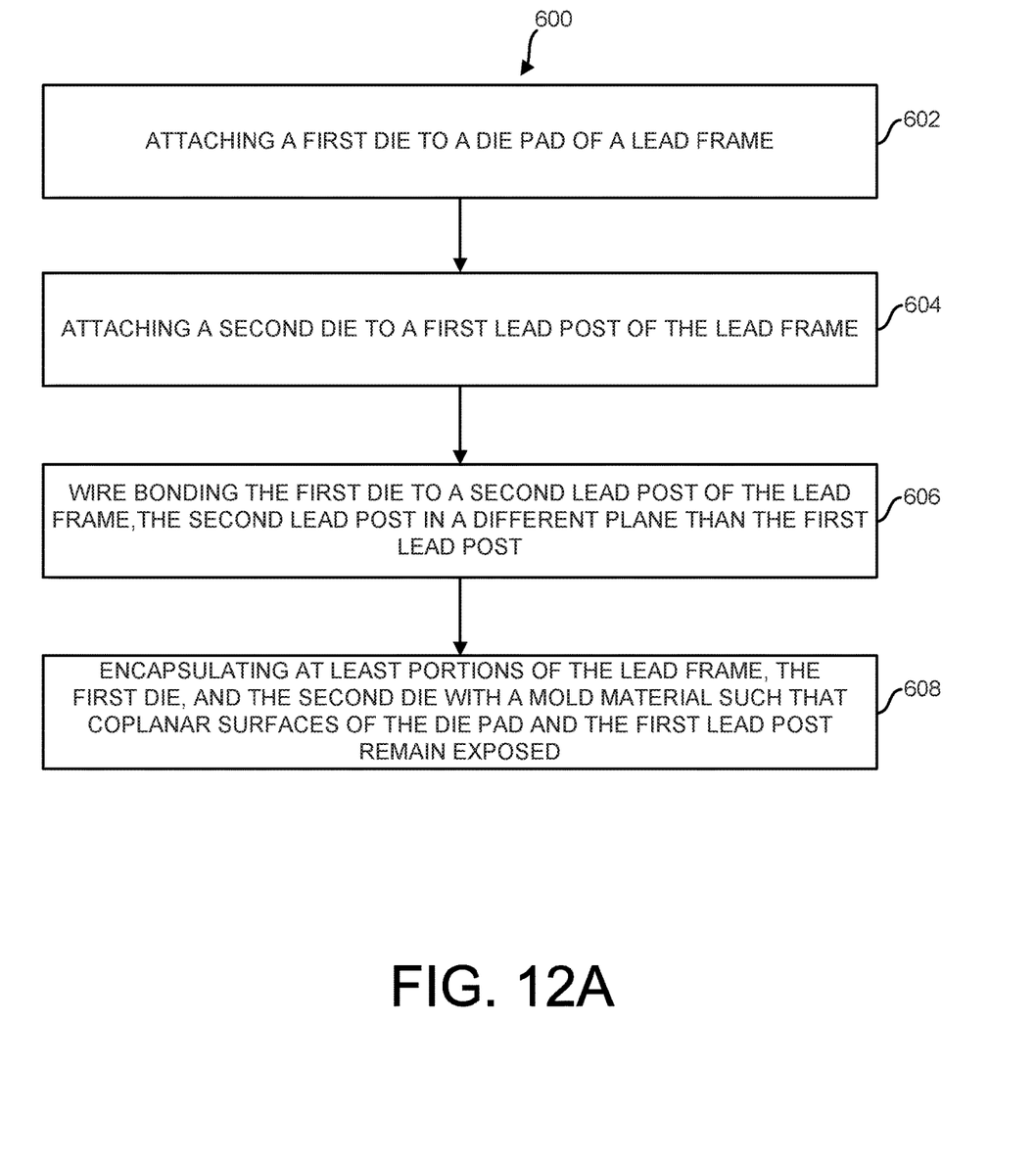
FIGS. 12A-12E are flow diagrams illustrating one example of a method for fabricating a semiconductor package.

As illustrated in FIG. 12A, at 602 method 600 includes attaching a first die to a die pad of a lead frame. At 604, method 600 includes attaching a second die to a first lead post of the lead frame. At 606, method 600 includes wire bonding the first die to a second lead post of the lead frame, the second lead post in a different plane than the first lead post. At 608, method 600 includes encapsulating at least portions of the lead frame, the first die, and the second die with a mold material such that coplanar surfaces of the die pad and the first lead post remain exposed.

Figure 12B:
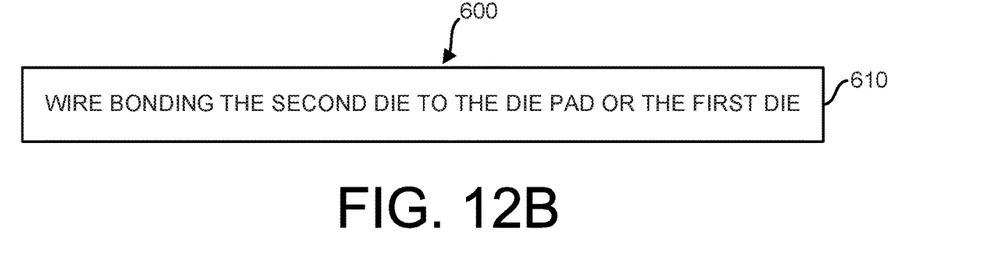
Figure 12C:
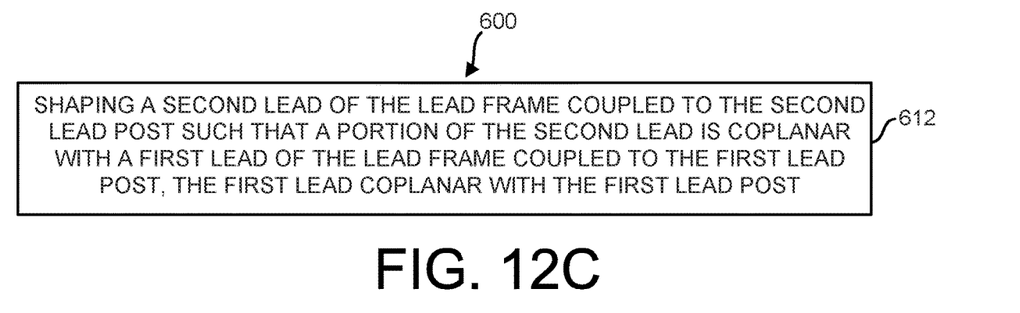
Figure 12D:
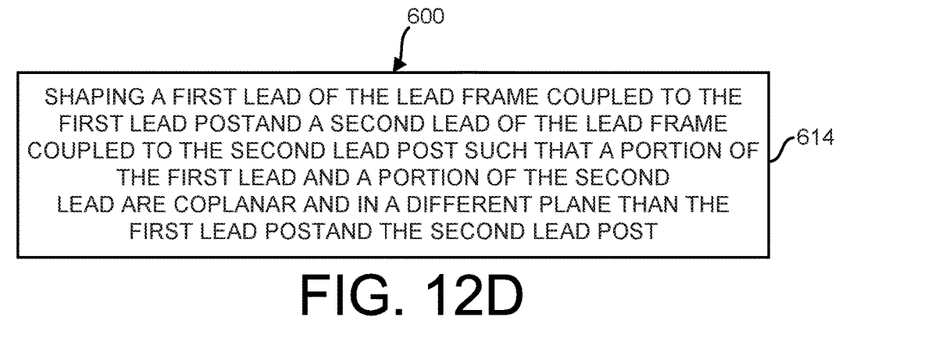
Figure 12E:
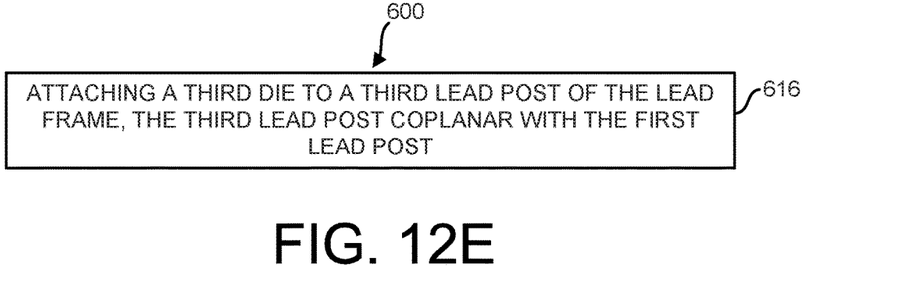

As illustrated in FIG. 12B, at 610 method 600 may further include wire bonding the second die to the die pad or the first die. As illustrated in FIG. 12C, at 612 method 600 may further include shaping a second lead of the lead frame coupled to the second lead post such that a portion of the second lead is coplanar with a first lead of the lead frame coupled to the first lead post, the first lead coplanar with the first lead post. As illustrated in FIG. 12D, at 614 method 600 may further include shaping a first lead of the lead frame coupled to the first lead post and a second lead of the lead frame coupled to the second lead post such that a portion of the first lead and a portion of the second lead are coplanar and in a different plane than the first lead post and the second lead post. As illustrated in FIG. 12E, at 616 method 600 may further include attaching a third die to a third lead post of the lead frame, the third lead post coplanar with the first lead post. In this case, the encapsulating includes encapsulating at least portions of the lead frame, the first die, the second die, and the third die with a mold material such that coplanar surfaces of the die pad, the first lead post, and the third lead post remain exposed.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A lead frame comprising:
a die pad having a surface;
a first lead post having a surface coplanar with the surface of the die pad, the first lead post in a first plane;
a first lead coupled to the first lead post;
a second lead post in a second plane different from the first plane; and
a second lead coupled to the second lead post,
wherein a thickness of the die pad is greater than a thickness of the first lead post.

2. The lead frame of claim 1, wherein the first lead is in the first plane, and
wherein the second lead comprises a first portion in the first plane, a second portion in the second plane, and a third portion extending between the first portion and the second portion.

3. The lead frame of claim 1, further comprising:
a plurality of first leads coupled to the first lead post; and
a plurality of second leads coupled to the second lead post.

4. A semiconductor package comprising:
a die pad having a first surface and a second surface opposite to the first surface of the die pad;
a first lead post having a first surface and a second surface opposite to the first surface of the first lead post;
a first lead coupled to the first lead post;
a second lead post;
a second lead coupled to the second lead post;
a first die attached to the second surface of the die pad;
a second die attached to the second surface of the first lead post; and
a mold material encapsulating at least portions of the die pad, the first lead post, the second lead post, the first die, and the second die such that the first surface of the die pad and the first surface of the first lead post are exposed,
wherein the first surface of the die pad and the first surface of the first lead post are coplanar.

5. The semiconductor package of claim 4, wherein the first lead post and the second lead post are in different planes.

6. The semiconductor package of claim 4, wherein the first lead is coplanar with the first lead post, and
wherein the second lead comprises a first portion coplanar with the first lead post, a second portion coplanar with the second lead post, and a third portion extending between the first portion and the second portion.

7. The semiconductor package of claim 4, wherein a thickness of the die pad is greater than a thickness of the first lead post.

8. A semiconductor package comprising:
a die pad that operates as a heat sink, having a first surface and a second surface opposite to the first surface of the die pad;
a first lead post having a first surface and a second surface opposite to the first surface of the first lead post;
a first lead coupled to the first lead post;
a plurality of second lead posts in a plane different from the first lead post;
a plurality of second leads coupled to the plurality of second lead posts;
a first die attached to the second surface of the die pad; and
a mold material encapsulating at least portions of the die pad, the first lead post, the second lead post, the first die, where the first surface of the die pad is exposed and void of mold material,
wherein in a direction perpendicular to the first surface and the second surface of the die pad, the plurality of second lead posts do not overlap the die pad.

9. The semiconductor package of claim 8, where the first surface of the die pad and the first surface of the first lead post are coplanar.

10. The semiconductor package of claim 9, where the first surface of the first lead post is exposed.

11. The semiconductor package of claim 8, where the first die pad has a thickness greater than a first lead post thickness.

12. The semiconductor package of claim 8, comprising a second die attached to the second surface of the first lead post.

13. The semiconductor package of claim 12, where the second die is of a type different than the first die.

14. The semiconductor package of claim 13, where the first die is a transistor die.

15. The semiconductor package of claim 8, wherein the first lead is coplanar with the first lead post, and
wherein each lead of the plurality of second leads comprises a first portion coplanar with the first lead post, a second portion coplanar with the plurality of second lead posts, and a third portion extending between the first portion and the second portion.

16. The semiconductor package of claim 8, comprising a second die attached to the second surface of the first lead post, where the second die is of a type different than the first die.

17. The semiconductor package of claim 16, comprising where the first surface of the die pad and the first surface of the first lead post are coplanar, and where the first surface of the first lead post is exposed and void of a mold material.

18. The semiconductor package of claim 16, where the first die pad has a thickness greater than a first lead post thickness.

19. The semiconductor package of claim 18, wherein the first lead is coplanar with the first lead post, and
wherein each lead of the plurality of second leads comprises a first portion coplanar with the first lead post, a second portion coplanar with the plurality of second lead posts, and a third portion extending between the first portion and the second portion.

20. The semiconductor package of claim 8, where the first lead and the plurality of second leads terminate at a different position.

* * * * *